United States Patent [19]
Sung

[11] Patent Number: 5,926,719
[45] Date of Patent: Jul. 20, 1999

[54] METHOD FOR FABRICATING A CROWN SHAPED CAPACITOR STRUCTURE

[75] Inventor: Jan Mye Sung, Yang Mei, Taiwan

[73] Assignee: Vanguard International Semiconductor Corporation, Hsin-Chu, Taiwan

[21] Appl. No.: 08/960,137

[22] Filed: Oct. 29, 1997

[51] Int. Cl.⁶ .............................................. H01L 21/8242
[52] U.S. Cl. ........................................... 438/396; 257/303
[58] Field of Search .................................... 438/253, 396, 438/397, 398

[56] References Cited

U.S. PATENT DOCUMENTS

| | | | |
|---|---|---|---|
| 5,278,091 | 1/1994 | Fazan et al. | 438/398 |
| 5,459,095 | 10/1995 | Huang et al. | 438/396 |
| 5,766,993 | 6/1998 | Tseng | 438/253 |
| 5,824,582 | 10/1998 | Tseng | 438/396 |
| 5,843,821 | 12/1998 | Tseng | 438/253 |

*Primary Examiner*—Olik Chaudhuri
*Assistant Examiner*—William David Coleman
*Attorney, Agent, or Firm*—George O. Saile; Stephen B. Ackerman

[57] ABSTRACT

A method for creating an STC structure, using a crown shaped storage node structure, to increase surface area, and to increase the capacitance, for high density, DRAM designs, has been developed. The process features creating the crown shaped, storage node structure, using only two photolithographic masking procedures. An insulator mesa is formed on an underlying polysilicon layer, to provide a shape needed for creation of polysilicon spacers, connecting to the underlying polysilicon layer. Timed, anisotropic RIE procedures, applied to the underlying polysilicon layer, and selective removal of the insulator mesa, result in the formation of the crown shaped, storage node structure, comprised of polysilicon spacers, connected to, and extending upwards, from an underlying polysilicon shape.

23 Claims, 5 Drawing Sheets

METHOD FOR FABRICATING A CROWN SHAPED CAPACITOR STRUCTURE

BACKGROUND OF THE INVENTION (1) Field of the Invention

The present invention relates to methods used for fabrication of high density, semiconductor memory cells, and more specifically to a process used to create a crown shaped capacitor structure, for a DRAM device, with increased capacitance resulting from the increased surface area of the crown shaped capacitor structure.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, and thus limiting the amount of area the overlying STC structure can occupy, without interfering with neighboring cells.

Solutions to the shrinking design area, assigned to STC structures, have been addressed via novel semiconductor fabrication processes which result in an increase in surface area for only the lower, or storage node electrode, of the STC structure, while maintaining the area original design area of the STC structure. One method for achieving this objective, described by Fazan, et al, in U.S. Pat. No. 5,278,091, is the creation of a lower polysilicon shape, or electrode, comprised of a hemispherical grained, (HSG) silicon layer, on the surface of the lower electrode. The rough surface of the HSG layer, results in an increase in lower electrode surface area, and thus an increase in STC capacitance. However the roughness of the HSG layer is strongly influenced by deposition conditions, making reproducibility of HSG roughness, and subsequent capacitance, difficult to achieve. This invention will describe a process for fabricating a crown shaped, STC structure, obtained by forming the crown shape for the lower electrode, or storage node shape. The crown shaped, storage node structure, allows the increase in surface area, or capacitance, to be realized without the use of, the difficult to control, HSG deposition procedure. The crown shaped, storage node structure, described in this invention, is created using only two photolithographic masking procedures, and features novel processing sequences, such as timed, polysilicon, dry etching procedures, needed to fabricate the crown shaped, storage node structure, used for the crown shaped, STC structure.

SUMMARY OF THE INVENTION

It is an object of this invention to create a DRAM device, featuring an STC structure, in which the surface area of the STC structure is increased by creating a polysilicon, crown shaped, storage node structure.

It is another object of this invention to create the polysilicon, crown shaped, storage node structure, using only two photolithographic masking procedures.

It is yet another object of this invention to create the polysilicon, crown shaped, storage node structure, using timed, anisotropic, dry etching procedures, for polysilicon definition.

In accordance with the present invention a method for fabricating a STC structure, with a crown shaped, storage node structure, for a DRAM device, is described. A transfer gate transistor comprised of: a thin gate insulator; a polysilicon gate structure; lightly doped source and drain regions; insulator spacers on the sidewalls of the polysilicon gate structure; and heavily doped source and drain regions; is formed on a semiconductor substrate. A first insulator layer is deposited, and planarized. A storage node contact hole is opened in the first insulator layer, exposing the source and drain region of the transfer gate transistor. A first polysilicon layer is deposited on top surface of the first insulator layer, completely filling the storage node contact hole. A second insulator layer is deposited on the first polysilicon layer, and patterned via photolithographic and dry etching procedures, to create an insulator mesa on the first polysilicon layer, directly overlying the polysilicon filled, storage node contact hole. A second polysilicon layer is deposited on the exposed surfaces of the insulator mesa, and on the top surface of the first polysilicon layer, in regions in which the first polysilicon layer is not covered by the insulator mesa. A first timed, selective, anisotropic dry etching procedure is used to remove the second polysilicon layer from the top surface of the insulator mesa, and from the top surface of the first polysilicon layer, in regions in which the first polysilicon layer is not covered by the insulator mesa, creating polysilicon spacers on the sides of the insulator mesa. A second timed, selective, anisotropic dry etching procedure is than used to remove a top portion of the first polysilicon layer, not protected by the insulator mesa, resulting in the formation of a bottom portion of the first polysilicon layer, surrounding the insulator mesa. The insulator mesa is next removed, followed by removal of the exposed bottom portion of the first polysilicon layer, resulting in a crown shaped, storage node structure, comprised of polysilicon spacers, residing on an unetched first polysilicon shape, with the unetched first polysilicon shape contacting a source and drain region, in the storage node contact hole. Formation of a capacitor dielectric layer, on the crown shaped, storage node structure, followed by the creation of an upper polysilicon electrode complete the fabrication procedure used to form a crown shaped, STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming an STC structure, for a DRAM device, with a crown shaped, storage node structure, with increased capacitance, resulting from the increased surface area realized from the crown shaped, lower electrode structure, will now be described. The transfer gate transistor, used for this DRAM device, featuring the crown shaped, storage node structure, will be described using an N channel device. However the STC structure, featuring the crown shaped, storage node structure, described in this invention, can also be applied to P channel, transfer gate transistor.

Figure 1:
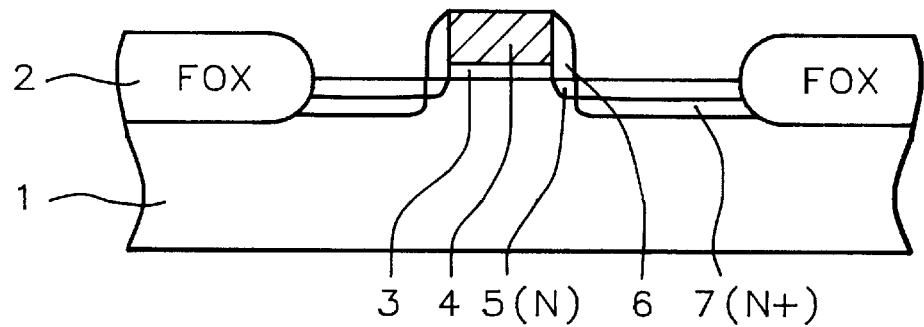
FIGS. 1–9, which schematically shows, in cross-sectional style, the key fabrication stages used in the creation of the crown shaped, STC structure.

Referring to FIG. 1, a P type, semiconductor substrate, 1, with a <100>, single crystalline orientation, is used. A field oxide, (FOX), region 2, is used for purposes of isolation. Briefly the FOX region 2, is formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX region 2, from growing on areas of substrate 1, to be used for subsequent device regions. After the growth of the FOX region 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam ambient, at a temperature between about 850 to 1050° C., to a thickness between about 50 to 150 Angstroms. A polysilicon gate layer is next deposited using low pressure chemical vapor deposition, (LPCVD), procedures, at a temperature between about 500 to 700° C., to a thickness between about 1000 to 3000 Angstroms. The polysilicon gate layer can be grown using in situ doping procedures, via the incorporation of either arsine or phosphine to the silane ambient, or the polysilicon gate layer can be grown intrinsically and doped via ion implantation, or $POCl_3$ procedures. Conventional photolithographic and reactive ion etching, (RIE), using $Cl_2$ as an etchant for the polysilicon gate layer, are used to create polysilicon gate structure 4, shown schematically in FIG. 1. Photoresist removal is accomplished via plasma oxygen ashing and careful wet cleans.

A lightly doped source and drain region 5, is next formed via ion implantation of phosphorous, at an energy between about 20 to 50 KeV, at a dose between about 1E13 to 1E14 atoms/$cm^2$. A sidewall insulator layer, of silicon oxide, is then deposited using either LPCVD or PECVD procedures, at a temperature between about 400 to 700° C., to a thickness between about 1500 to 4000 Angstroms, followed by an anisotropic RIE procedure, using $CHF_3$ as an etchant, creating insulator spacer 6, on the sidewalls of polysilicon gate structure 4. A heavily doped source and drain region 7, is then formed via ion implantation of arsenic, at an energy between about 30 to 80 KeV, at a dose between about 1E15 to 1E16 atoms/$cm^2$. The result of these procedures are again schematically shown in FIG. 1.

Figure 2:
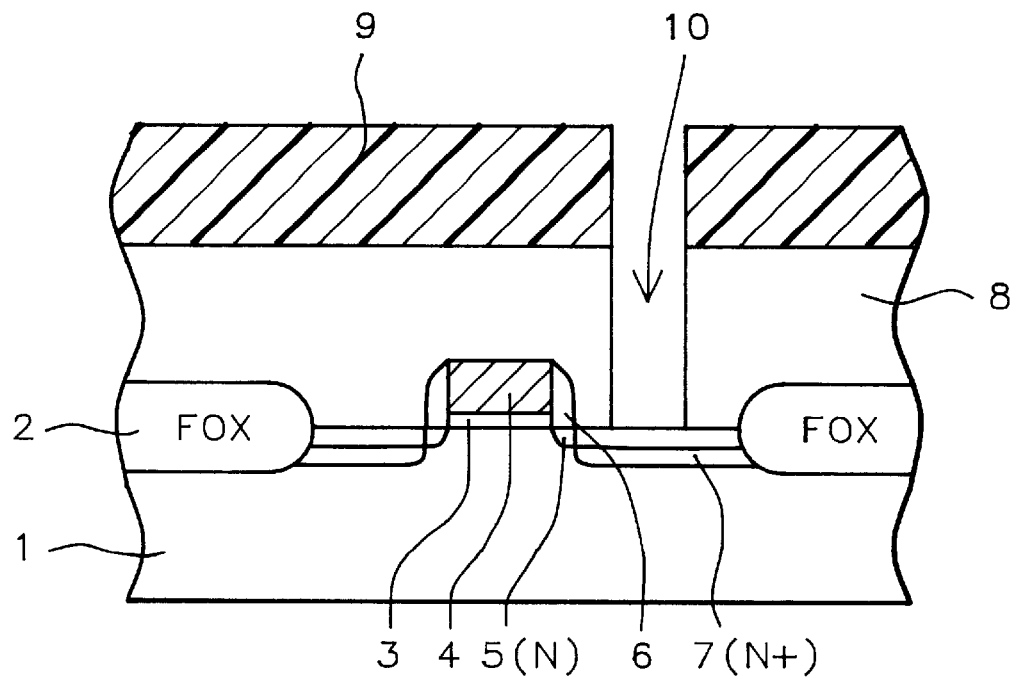

An insulator layer 8, of silicon oxide, is next deposited using LPCVD or PECVD procedures, at a temperature between about 400 to 700° C., to a thickness between about 5000 to 10000 Angstroms. Planarization of insulator layer 8, is performed using chemical mechanical polishing procedures, to create the smooth topography, shown schematically in FIG. 2. The first photolithographic masking procedure, used to create the crown shaped, storage node structure is next addressed. Photoresist shape 9, is formed on insulator layer 8, followed by conventional photolithographic and RIE procedures, using $CHF_3$ as an etchant, opening storage node contact hole 10, in insulator layer 8, exposing the top surface of heavily doped source and drain region 7.

Figure 3:
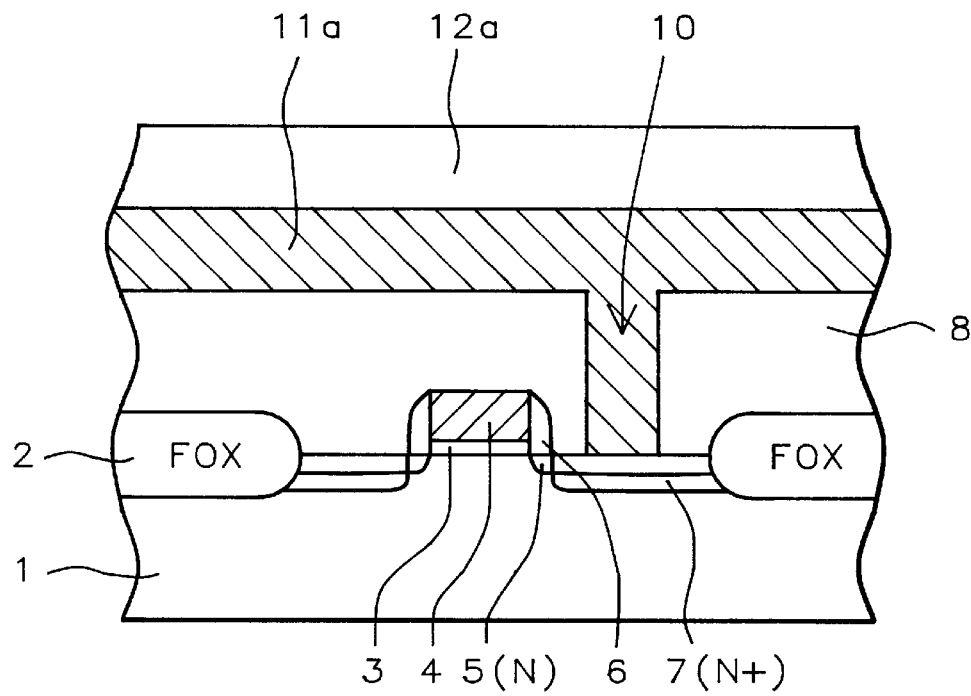

After removal of photoresist shape 9, via use of plasma oxygen ashing and careful wet cleans, A polysilicon 11a, is next deposited, via LPCVD, featuring in situ doping procedures, accomplished via the addition of either arsine or phosphine, to a silane ambient. Polysilicon layer 11a, is deposited at a temperature between about 500 to 700° C., to a thickness between about 1000 to 2000 Angstroms, completely filling storage node contact hole 10. This is schematically shown in FIG. 3. Another insulator layer 12a, shown schematically in FIG. 3, is next deposited, again using LPCVD or PECVD procedures, at a temperature between about 400 to 700° C., to a thickness between about 5000 to 10000 Angstroms.

Figure 4:
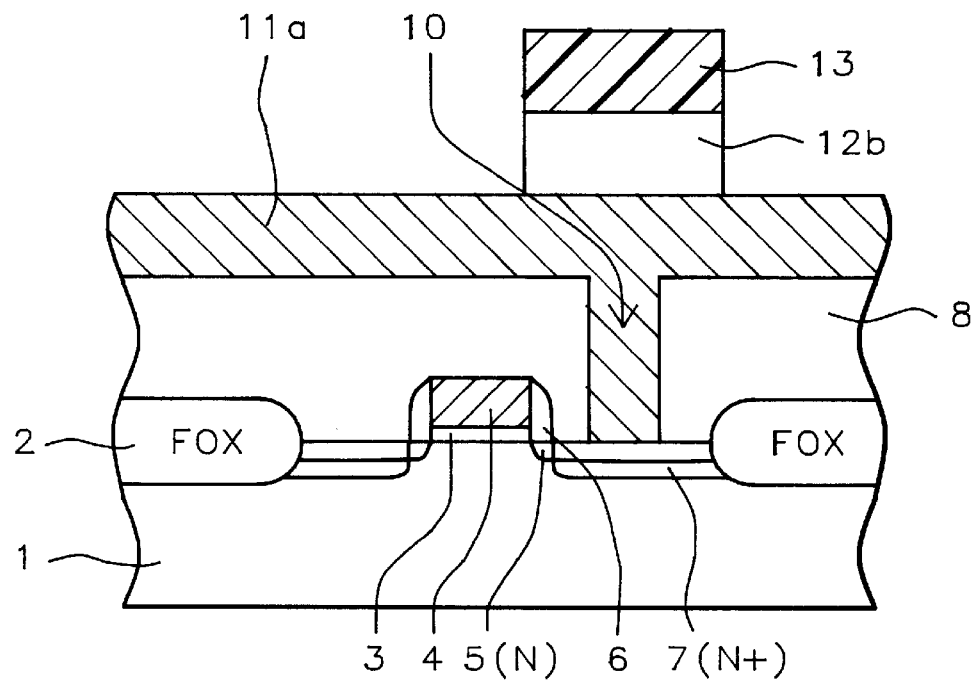

The second photolithographic masking procedure, used to form the crown shaped, storage node structure, is next employed. Photoresist shape 13, is used as a mask to allow insulator mesa 12b, to be formed via selective, anisotropic reactive ion etching, (RIE), using $CHF_3$ as an etchant. The selective RIE ambient allows the creation of insulator mesa 12b, to be accomplished without attack of underlying first polysilicon layer 11a, during a $CHF_3$ over etch procedure, used to insure complete removal of insulator layer 12a, in regions not covered by photoresist shape 13. This is schematically shown in FIG. 4. Insulator mesa 12b, directly overlays the narrower polysilicon filled, storage node contact hole 10.

Figure 5:
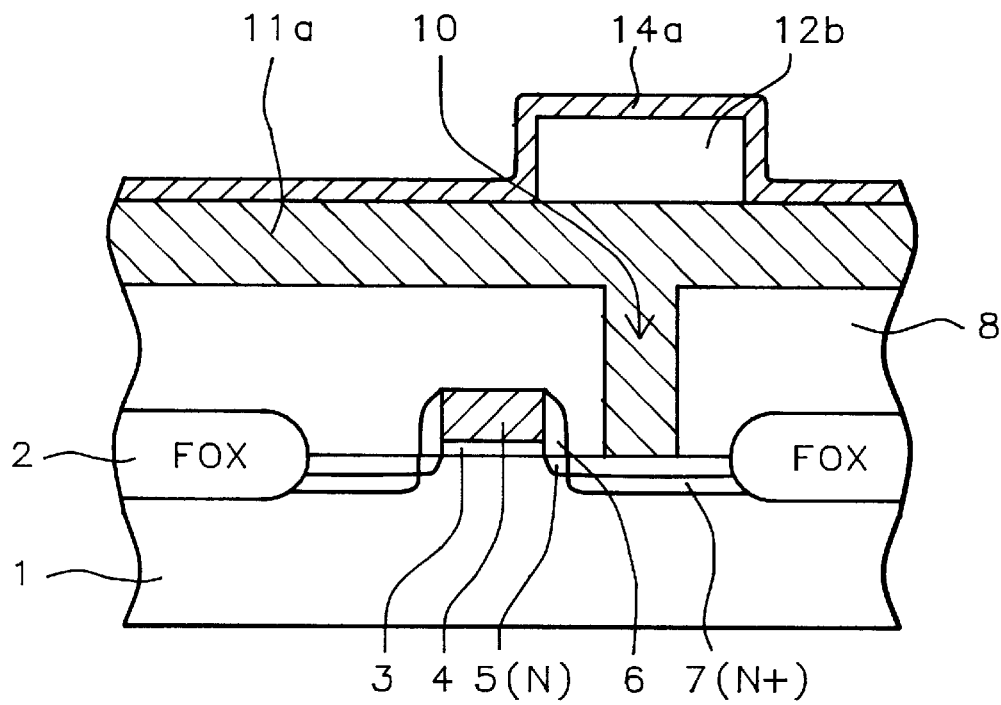
Figure 6:
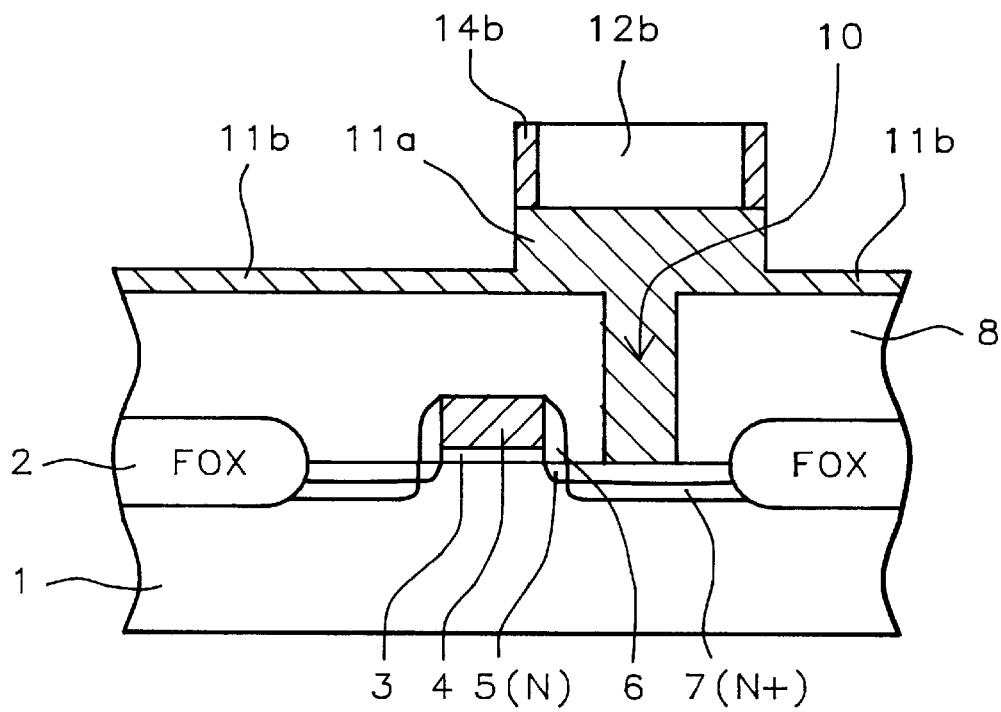

After removal of photoresist shape 13, via plasma oxygen ashing and careful wet cleans, a thin polysilicon layer 14a, is deposited using LPCVD procedures, to a thickness between about 500 to 1000 Angstroms. Polysilicon layer 14a, is deposited using an N type, in situ doping procedure, accomplished via the addition of phosphine to a silane ambient. This is schematically shown in FIG. 5. A critical, anisotropic RIE procedure is next used to initiate formation of the polysilicon, lower electrode shape. The RIE procedure, using $Cl_2$ as the selective etchant for polysilicon, is timed to initially remove polysilicon layer 14a, from the top surface of insulator mesa 12b, forming polysilicon spacers 14b, on the sides of insulator mesa 10b. This procedure also removes polysilicon layer 14a, from the top surface of underlying polysilicon layer 11a, in regions in which polysilicon layer 11a, is not covered by insulator mesa 10b. The selectivity of $Cl_2$ does not allow the etching of insulator mesa 10b, to occur at polysilicon end point. The timed, anisotropic RIE procedure, is than continued to remove the exposed top portion of polysilicon layer 11a, resulting in a thinner polysilicon layer 11b, between about 500 to 1000 Angstroms in thickness, now residing on underlying insulator layer 8, in regions in which polysilicon layer 11a, is not covered by insulator mesa 10b. This is schematically shown in FIG. 6.

Figure 7:
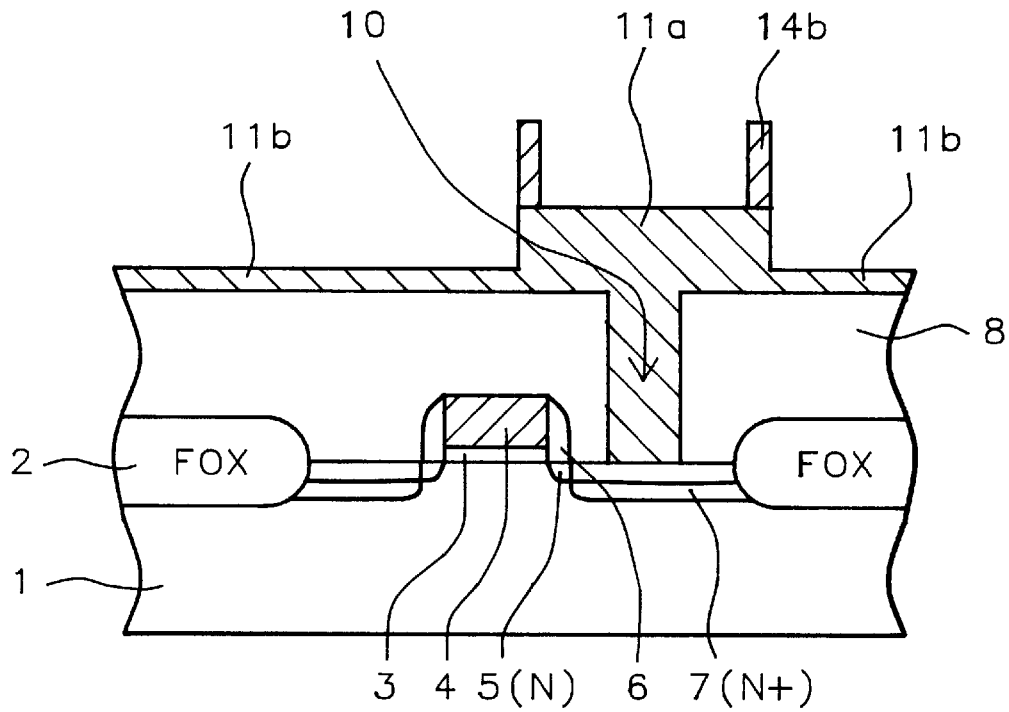
Figure 8:
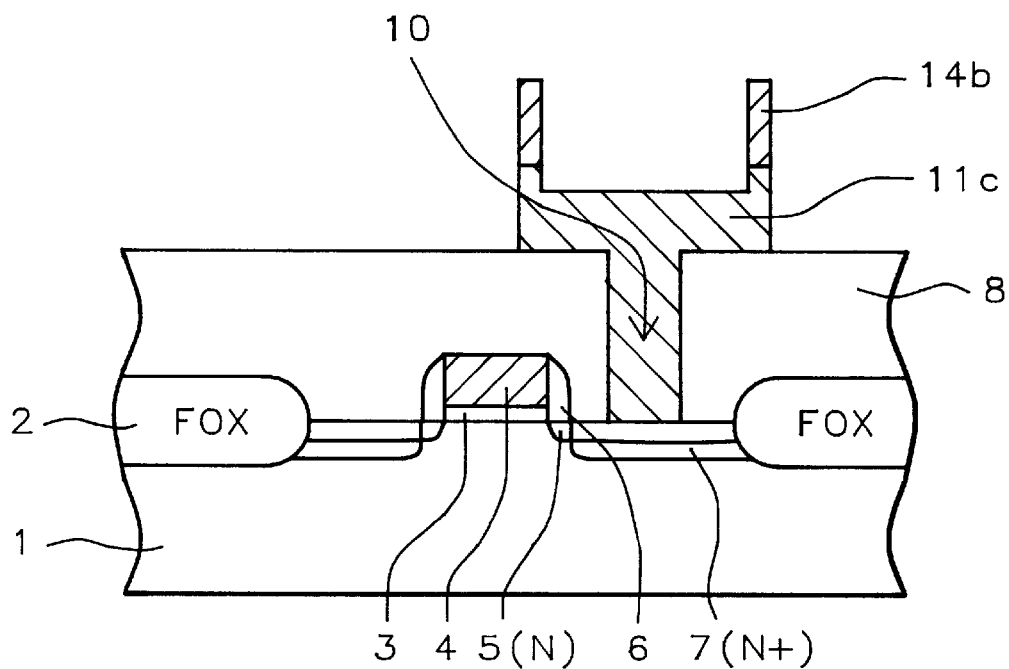

The removal of insulator mesa 10b, is next addressed. A selective etching, using either a buffered HF wet procedure, or a dry RIE procedure, using $CHF_3$ as an etchant, selectively removes insulator mesa 10b, resulting in the protruding polysilicon spacers 14b, extending upwards from the underlying polysilicon shape, comprised of unetched polysilicon layer 11a. The thin polysilicon layer 11b, protected insulator layer 8, from this procedure. This is shown schematically in FIG. 7. The final shape for the crown shaped, storage node structure is realized via use of another anisotropic RIE procedure, using $Cl_2$ as an etchant, selectively removing thin polysilicon layer 11b, from the top surface of insulator layer 8. This is schematically shown in FIG. 8. This procedure also results in the thinning of polysilicon layer 11a, between polysilicon spacers 14b, resulting in polysilicon shape 11c, between about 500 to 1000 Angstroms in thickness.

The magnitude of the increase in surface area, realized via the formation of the crown shaped, storage node structure, can be adjusted by the thickness of the insulator spacer, influencing the height of the subsequent polysilicon spacers.

Figure 9:
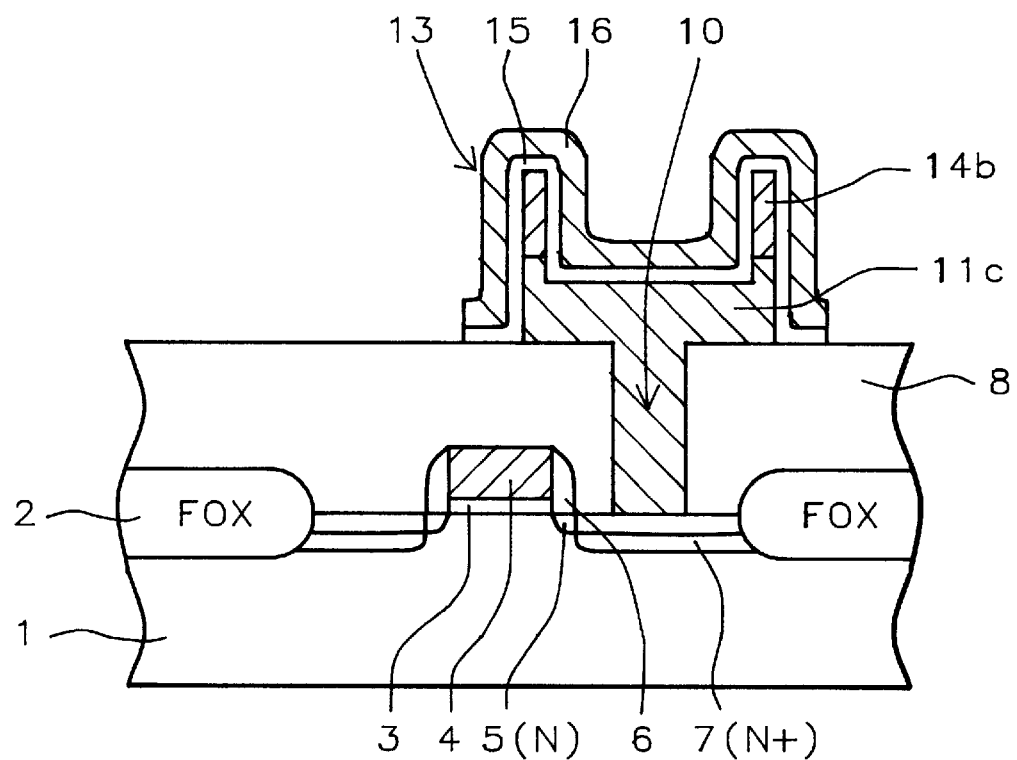

FIG. 9, schematically shows the completion of the STC structure, featuring the crown shaped storage node structure. A capacitor dielectric layer 15, is formed, overlying the crown shaped, storage node structure. Capacitor dielectric layer 15, can be an insulator layer possessing a high dielectric constant, such as $Ta_2O_5$, obtained via r.f sputtering techniques, at a thickness between about 10 to 100 Angstroms. Capacitor dielectric layer 17, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of a top portion of the silicon nitride layer results in the formation of a silicon oxynitride layer on the unoxidized portion of silicon nitride, overlying the silicon oxide layer, and at a silicon oxide equivalent thickness of between about 40 to 80 Angstroms. Finally another layer of polysilicon is deposited, via LPCVD procedures, at a temperature between about 500 to 700° C., to a thickness between about 1000 to 3000 Angstroms. Doping of this polysilicon layer is accomplished via the in situ deposition procedure, again via the addition of phosphine, to a silane ambient. Photolithographic and RIE procedures, using $Cl_2$ as an etchant, are next employed to create polysilicon upper electrode, or plate electrode, 16, shown schematically in FIG. 9. The STC structure 17, featuring the crown shaped, storage node structure, schematically shown in FIG. 9, with the increased surface area resulting from polysilicon spacers 14b, and underlying polysilicon shape 11c, offers increased capacitance when compared to counterpart STC structures, fabricated with flat storage node electrode shapes. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a stacked capacitor, (STC), structure, featuring a crown shaped, storage node structure, on a semiconductor substrate, comprising the steps of:

providing a transfer gate transistor;

depositing a first insulator layer on said transfer gate transistor;

forming a storage node contact hole in said first insulator layer, exposing a source and drain region of said transfer gate transistor;

depositing a first polysilicon layer on said first insulator layer, completely filling said storage node contact hole;

forming an insulator mesa, from a second insulator layer, on said first polysilicon layer, directly overlying said storage node contact hole;

forming polysilicon spacers, from a second polysilicon layer, on the sides of said insulator mesa;

removing a top portion of said first polysilicon layer, in a region not covered by said insulator mesa, leaving a thin, bottom portion of said first polysilicon layer, remaining on said first insulator layer, in regions not covered by said insulator mesa, and leaving said insulator mesa, with attached, said polysilicon spacers, overlying an unetched, first polysilicon shape;

removing said insulator mesa;

removing said thin, bottom portion of said first polysilicon layer, from top surface of said first insulator layer, resulting in a crown shaped, storage node structure, comprised of said polysilicon spacers, protruding upwards from said first polysilicon shape;

forming a capacitor dielectric layer on said crown shaped, storage node structure; and forming a polysilicon, upper electrode, on said capacitor dielectric layer.

2. The method of claim 1, wherein said transfer gate transistor is either an N channel or P channel MOSFET with a silicon dioxide gate insulator layer, a polysilicon gate structure, insulator sidewall spacers, and either N type or P type source and drain regions.

3. The method of claim 1, wherein said first polysilicon layer is deposited via LPCVD procedures, to a thickness between about 1000 to 2000 Angstroms, using an situ doping procedure accomplished by the addition of either arsine or phosphine to a silane ambient.

4. The method of claim 1, wherein said insulator mesa is formed by initially depositing an insulator layer, via LPCVD or PECVD procedures, to a thickness between about 5000 to 10000 Angstroms, followed by patterning of the insulator layer, to create said insulator mesa, via an photolithographic procedure, and an anisotropic RIE procedure, using $CHF_3$ as an etchant.

5. The method of claim 1, wherein said polysilicon spacers are formed on the sides of said insulator mesa by initially depositing a thin polysilicon layer via LPCVD procedures, to a thickness between about 500 to 1000 Angstroms, followed by an anisotropic RIE procedure, using $Cl_2$ as an etchant.

6. The method of claim 1, wherein said top portion, of said first polysilicon layer, not covered by said insulator mesa, is removed via a timed, anisotropic RIE procedure, using $Cl_2$ as an etchant, leaving said thin bottom portion, of said first polysilicon layer, between about 500 to 1000 Angstroms in thickness, remaining on underlying, said first insulator layer.

7. The method of claim 1, wherein said insulator mesa is selectively removed from underlying, unetched first polysilicon layer, using either a buffered hydrofluoric acid solution, or via an anisotropic RIE procedure, using $CHF_3$ as an etchant.

8. The method of claim 1, wherein said thin, bottom portion, of said first polysilicon layer, is selectively removed from underlying, said first insulator layer, via anisotropic RIE procedures, using $Cl_2$ as an etchant.

9. The method of claim 1, wherein said crown shaped, storage node electrode, is comprised of said polysilicon spacers, residing on underlying, said first polysilicon shape, with said first polysilicon shape between about 500 to 1000 Angstroms, in thickness.

10. The method of claim 1, wherein said capacitor dielectric layer is composed of silicon oxynitride—silicon nitride—silicon oxide, (ONO), obtained by thermal oxidation of the top surface of said storage node electrode, to form a silicon oxide layer, between about 10 to 50 Angstroms, followed by a deposition of silicon nitride, to a thickness between about 10 to 20 Angstroms, and thermal oxidation of a top portion of said silicon nitride layer, creating a silicon oxynitride layer, on the unoxidized silicon nitride layer, overlying said silicon oxide layer.

11. A method of fabricating a crown shaped, storage node structure, to increase the surface area of a stacked capacitor, (STC), structure, for a DRAM device, on a semiconductor substrate, comprising the steps of:

providing a transfer gate transistor, on said semiconductor substrate;

depositing a first insulator layer on underlying said transfer gate transistor;

a first photolithographic procedure, followed by an anisotropic RIE procedure, opening a storage node contact hole in said first insulator layer, exposing a source and drain region of said transfer gate transistor, in the bottom of said storage node contact hole;

depositing an in situ doped, first polysilicon layer on the top surface of said first insulator layer, and completely filling said storage node contact hole;

depositing a second insulator layer on said in situ doped, first polysilicon layer;

a second photolithographic procedure, followed by an anisotropic RIE procedure, forming an insulator mesa on said in situ doped, first polysilicon layer;

depositing a thin, second polysilicon layer;

a first, timed, anisotropic RIE procedure, creating polysilicon spacers, from said thin, second polysilicon layer, on the sides of said insulator mesa;

a second, timed, anisotropic RIE procedure, removing a top portion of said in situ doped, first polysilicon layer, from the top surface of said first insulator layer, not covered by said insulator mesa, and leaving a thin, bottom portion, of said in situ doped, first polysilicon layer, on the top surface of said first insulator layer;

removal of said insulator mesa, exposing a first polysilicon shape, comprised of an unetched region, of said in situ doped, first polysilicon layer;

selectively removing said thin, bottom portion, of said in situ doped, first polysilicon layer, from top surface of said first insulator layer, resulting in said crown shaped, storage node structure, comprised of said polysilicon spacers, extending upwards from said first polysilicon shape;

forming a capacitor dielectric layer on said crown shaped, storage node structure; and forming a polysilicon, upper electrode, on said capacitor dielectric layer.

12. The method of claim 11, wherein said transfer gate transistor is either an N channel or a P channel MOSFET device with a silicon dioxide gate insulator layer, with a polysilicon gate structure and insulator sidewall spacers, and with either N type or P type source and drain regions.

13. The method of claim 11, wherein said first insulator layer is a silicon oxide layer, deposited using LPCVD or PECVD procedures, at a temperature between about 400 to 700° C., to a thickness between about 5000 to 10000 Angstroms.

14. The method of claim 11, wherein said in situ doped, first polysilicon layer, is obtained via LPCVD procedures, at temperature between about 500 to 700° C., to a thickness between about 1000 to 2000 Angstroms, via the addition of either arsine or phosphine, to a silane ambient.

15. The method of claim 11, in wherein said second insulator layer is deposited using either LPCVD or PECVD procedures, at a temperature between about 400 to 700° C., to a thickness between about 5000 to 10000 Angstroms.

16. The method of claim 11, wherein said insulator mesa is formed using said second photolithographic and RIE procedure, using $CHF_3$ as an etchant.

17. The method of claim 11, wherein said thin, second polysilicon layer, is deposited using LPCVD procedures, to a thickness between about 500 to 1000 Angstroms.

18. The method of claim 11, wherein said polysilicon spacers are formed using said first, timed, anisotropic RIE procedure, applied to said thin, second polysilicon layer, using $Cl_2$ as an etchant.

19. The method of claim 11, wherein said second timed, anisotropic RIE procedure is used to remove the top portion of said in situ doped, first polysilicon layer, using $Cl_2$ as an etchant, resulting in said thin, bottom portion, of said in situ doped, first polysilicon layer, at a thickness between about 500 to 1000 Angstroms, remaining on the top surface of said first insulator layer.

20. The method of claim 11, wherein said insulator mesa is selectively removed from underlying, unetched, in situ doped, first polysilicon layer, using either a buffered hydrofluoric acid solution, or an anisotropic RIE procedure, using $CHF_3$ as an etchant.

21. The method of claim 11, wherein said thin, bottom portion, of said in situ doped, first polysilicon layer, is selectively removed from the top surface of said first insulator layer via an anisotropic RIE procedure, using $Cl_2$ as an etchant.

22. The method of claim 11, wherein said capacitor dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing the top portion of said silicon nitride layer to from a silicon oxynitride layer on the bottom portion of said silicon nitride layer, overlying said thin silicon oxide layer.

23. The method of claim 11, wherein said polysilicon, upper electrode, of said STC structure, is formed from an in situ doped polysilicon layer, deposited using LPCVD procedures to a thickness between about 1000 to 3000 Angstroms, and patterned via anisotropic RIE procedures, using $Cl_2$ as an etchant.

* * * * *